(12) United States Patent
Boivin

(10) Patent No.: US 12,262,649 B2
(45) Date of Patent: Mar. 25, 2025

(54) PHASE-CHANGE MEMORY

(71) Applicant: STMICROELECTRONICS (ROUSSET) SAS, Rousset (FR)

(72) Inventor: Philippe Boivin, Venelles (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 585 days.

(21) Appl. No.: 17/508,754

(22) Filed: Oct. 22, 2021

(65) Prior Publication Data

US 2022/0140233 A1 May 5, 2022

(30) Foreign Application Priority Data

Oct. 29, 2020 (FR) ...................................... 2011088

(51) Int. Cl.
*H10N 70/20* (2023.01)
*H10N 70/00* (2023.01)

(52) U.S. Cl.
CPC ......... *H10N 70/231* (2023.02); *H10N 70/021* (2023.02); *H10N 70/063* (2023.02); *H10N 70/882* (2023.02)

(58) Field of Classification Search
CPC .................................................. H10N 70/231
See application file for complete search history.

(56) References Cited

U.S. PATENT DOCUMENTS

| | | | |
|---|---|---|---|
| 7,969,771 B2 | 6/2011 | Xi et al. | |
| 8,971,089 B2 | 3/2015 | Karpov et al. | |
| 10,510,951 B1 | 12/2019 | Yu et al. | |
| 11,882,684 B2 | 1/2024 | Widjaja et al. | |
| 11,882,708 B2 | 1/2024 | Seo | |
| 2004/0203183 A1 | 10/2004 | Cho et al. | |
| 2005/0161747 A1 | 7/2005 | Lung et al. | |
| 2007/0242504 A1 | 10/2007 | Wicker | |
| 2008/0048213 A1 | 2/2008 | Liu | |
| 2009/0057643 A1 | 3/2009 | Chen | |
| 2009/0184306 A1 | 7/2009 | Mathew et al. | |
| 2009/0184309 A1 | 7/2009 | Mathew et al. | |
| 2010/0006814 A1* | 1/2010 | Chen | H10N 70/8828 438/102 |
| 2014/0264244 A1 | 9/2014 | Hong et al. | |
| 2019/0131520 A1 | 5/2019 | Morin et al. | |
| 2019/0131521 A1 | 5/2019 | Morin et al. | |
| 2019/0140176 A1 | 5/2019 | Arnaud et al. | |
| 2019/0267543 A1 | 8/2019 | Katono et al. | |
| 2019/0312088 A1 | 10/2019 | Boivin et al. | |
| 2019/0386213 A1 | 12/2019 | Lai et al. | |
| 2020/0066978 A1 | 2/2020 | Jeon et al. | |
| 2020/0066985 A1 | 2/2020 | Park et al. | |

(Continued)

FOREIGN PATENT DOCUMENTS

| | | |
|---|---|---|
| CN | 101626060 A | 1/2010 |
| CN | 110943161 A | 3/2020 |

(Continued)

OTHER PUBLICATIONS

Hou, "Magnetic thin film Fe ring structures and devices," dissertation, University of Washington, 2014, 178 pages.

(Continued)

*Primary Examiner* — Moazzam Hossain
*Assistant Examiner* — Hajar Kolahdouzan
(74) *Attorney, Agent, or Firm* — Seed IP Law Group LLP

(57) ABSTRACT

The present description concerns a device including phase-change memory cells, each memory cell including a first resistive element in lateral contact with a second element made of a phase-change material.

20 Claims, 5 Drawing Sheets

(56) References Cited

U.S. PATENT DOCUMENTS

| | | |
|---|---|---|
| 2020/0075854 A1 | 3/2020 | Park et al. |
| 2020/0098989 A1 | 3/2020 | Canvel et al. |
| 2020/0136036 A1 | 4/2020 | Wu et al. |
| 2020/0152870 A1 | 5/2020 | Lin et al. |
| 2020/0161370 A1 | 5/2020 | Kuo |
| 2020/0328347 A1 | 10/2020 | Leobandung |
| 2020/0395537 A1 | 12/2020 | Ok et al. |
| 2020/0411695 A1 | 12/2020 | Sung et al. |
| 2021/0013095 A1 | 1/2021 | Tran et al. |
| 2024/0023468 A1 | 1/2024 | Fleury et al. |

FOREIGN PATENT DOCUMENTS

| | | |
|---|---|---|
| CN | 113555501 A | 10/2021 |
| CN | 218004905 U | 12/2022 |
| KR | 20070094194 A | 9/2007 |
| WO | WO 2004057618 A2 | 7/2004 |
| WO | WO 2021176908 A1 | 9/2021 |

OTHER PUBLICATIONS

Verdy et al., "Improved Electrical Performance Thanks to Sb and N Doping in Se-Rich GeSe-Based OTS Selector Devices," 2017 IEEE International Memory Workshop (IMW), Monterey, CA, USA, 2017, pp. 1-4.

Gao et al., "The ovonic threshold switching characteristics in $Si_xTe1-_x$ based selector devices," *Applied Physics A* 124(734): 2018, 8 pages.

Kim et al., "High-performance, cost effective 2z nm two-deck cross-point memory integrated by self-align scheme for 128 Gb SCM," IEEE International Electron Devices Meetin (IEDM), Dec. 1-5, 2018, San Francisco, California, pp. 851-854.

\* cited by examiner

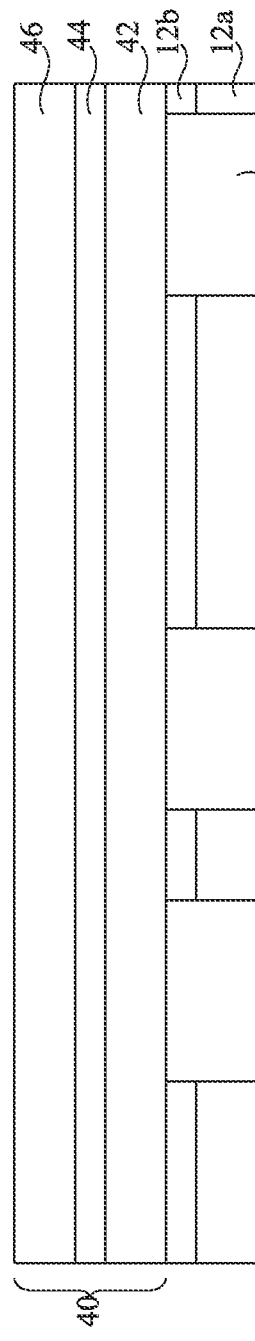
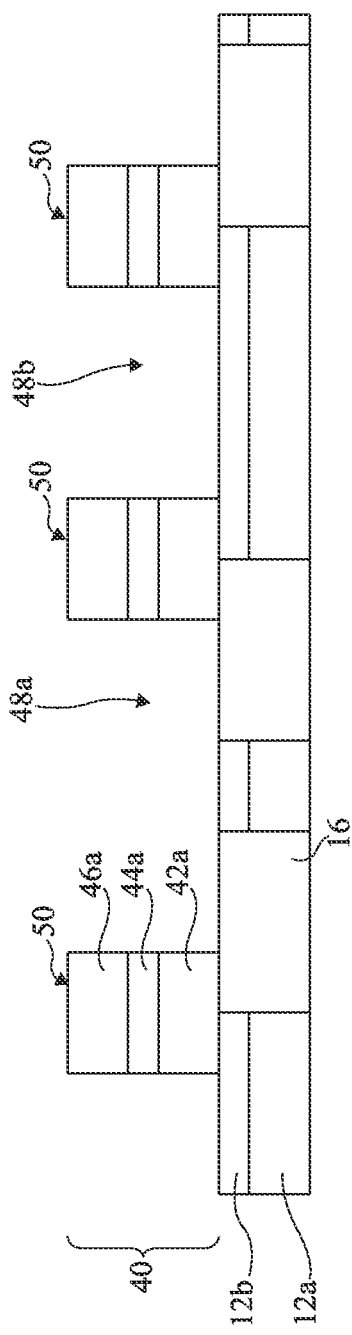
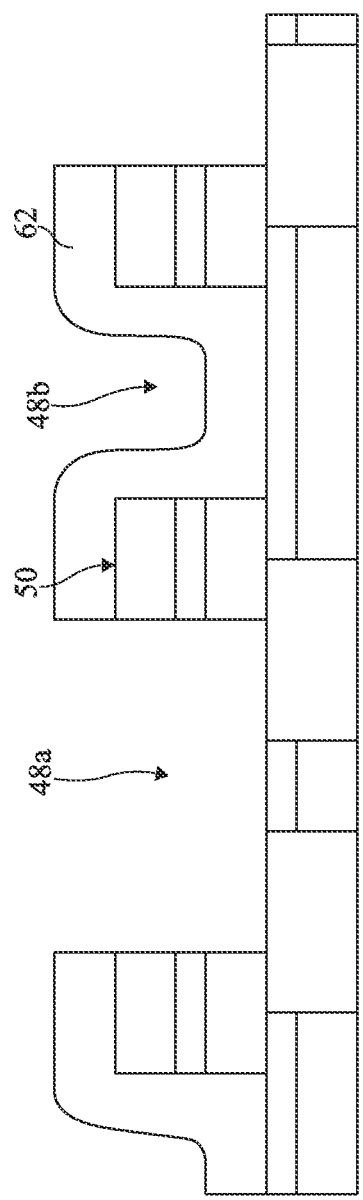

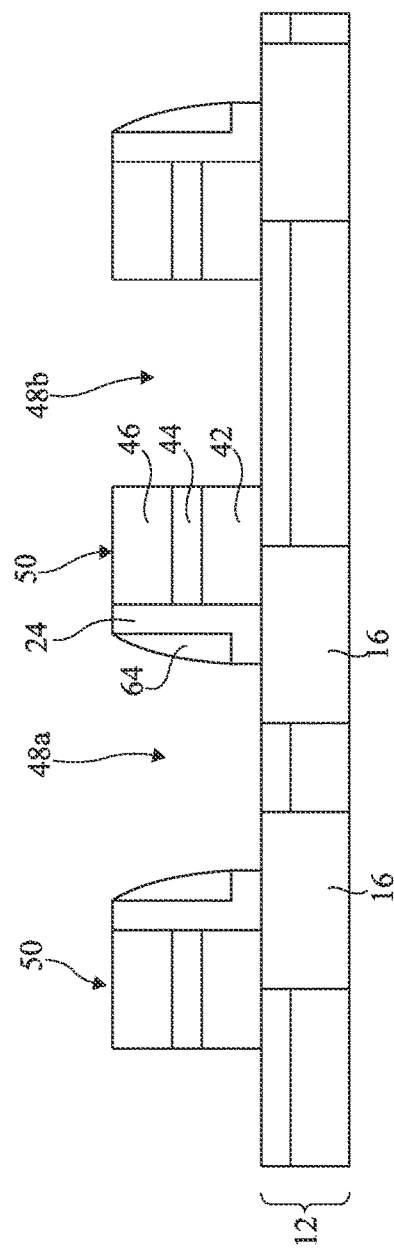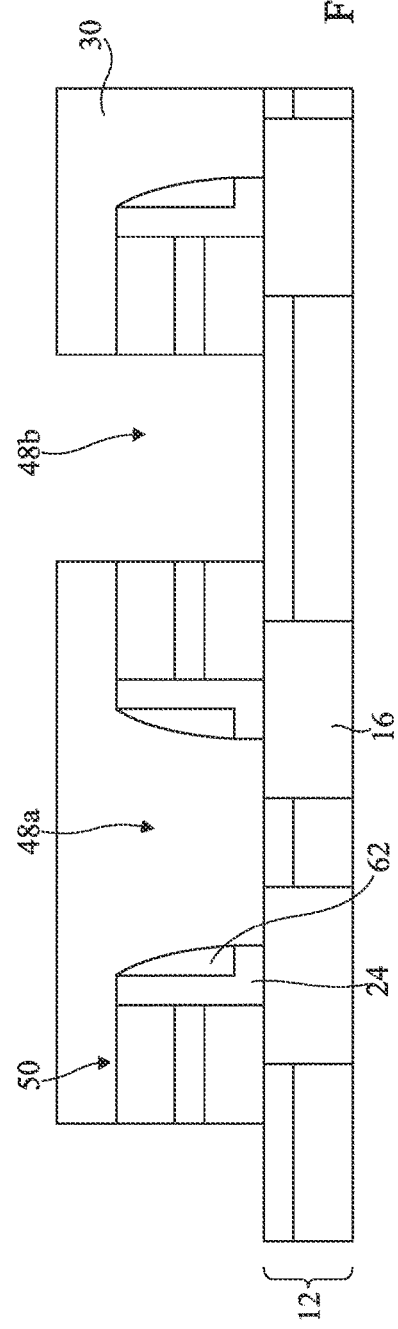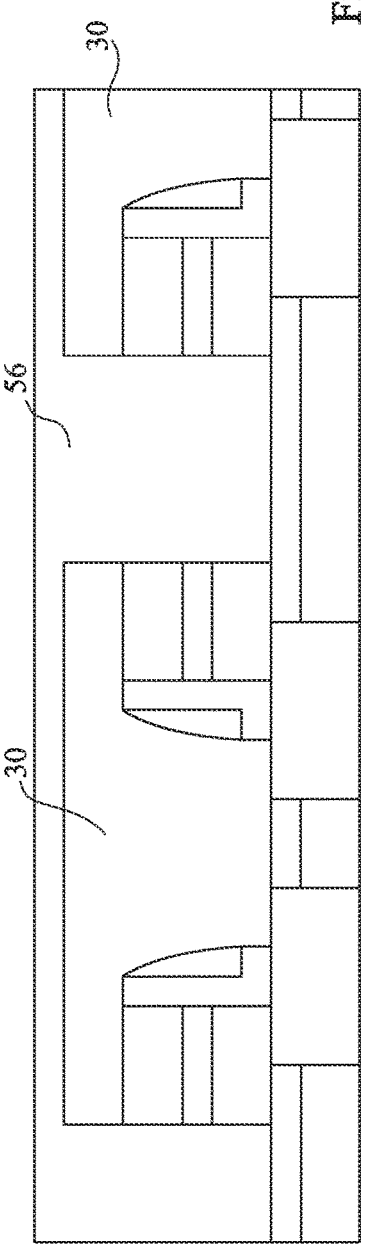

PHASE-CHANGE MEMORY

CROSS-REFERENCE TO RELATED APPLICATION(S)

This application claims the priority benefit of French patent application number 20/11088, filed on Oct. 29, 2020, entitled "Phase-change memory," which is hereby incorporated by reference to the maximum extent allowable by law.

BACKGROUND

Technical Field

The present disclosure generally concerns electronic devices and their manufacturing methods, and more particularly devices comprising phase-change memories.

Description of the Related Art

In a usual phase change memory, for example, each memory cell comprises a layer of a phase change material in contact with a resistive element. Phase-change materials are materials that may switch between a crystal phase and an amorphous phase. Such a switching is caused by an increase in the temperature of the resistive element through which an electric current is conducted. The difference in electric resistance between the amorphous phase of the material and its crystal phase is used to define at least two memory states, arbitrarily 0 and 1.

Memories are generally in the form of arrays, comprising word lines and bit lines, that is, rows and columns. A memory cell, containing binary information, is located at each crossing of a row and of a column.

The data contained in a cell of a phase-change memory are for example, accessed, or read out, by measurement of the resistance between the bit line and the word line of the memory cell.

The phase-change memory cells are for example located in an interconnection network. Interconnection network designates a stack of insulating layers, forming during the so-called "back end of line" manufacturing steps, where metal track coupled together by conductive vias are located. The levels of the interconnection network, each comprising conductive tracks in an insulating layer and conductive vias in an insulating layer, have a constant height. However, known memory cells are too high to be placed between certain levels without locally modifying the height of the level.

There is a need for phase-change memory cells having a smaller height than known phase-change memory cells, so that they can be entirely located in a level of an interconnection network.

BRIEF SUMMARY

An embodiment overcomes all or part of the disadvantages of known phase-change memories.

An embodiment provides a device comprising phase-change memory cells, each memory cell comprising a first resistive element in lateral contact with a second element made of a phase-change material.

Another embodiment provides a method of manufacturing a device comprising phase-change memory cells, the method comprising the forming, for each cell, of a first resistive element in lateral contact with a second element made of a phase-change material.

According to an embodiment, the first element is L-shaped.

According to an embodiment, the first element has the shape of a spacer.

According to an embodiment, the first element comprises a lower surface in contact with a conductive track, the track being surrounded with a first insulating layer.

According to an embodiment, the second element is separated from the first insulating layer and from the conductive track by an insulating portion.

According to an embodiment, the second element is a planar and horizontal layer.

According to an embodiment, a first sidewall of the second element is in contact with a substantially vertical wall of the first element.

According to an embodiment, a second sidewall of the second element, opposite to the first wall, is in contact with a conductive strip.

According to an embodiment, a second sidewall of the second element, opposite to the first wall, is in contact with a fourth selection element, the fourth element being covered with a conductive strip.

According to an embodiment, the device comprises an interconnection network, and each memory cell is located between two levels of the interconnection network.

According to an embodiment, the second element is made of a chalcogen-based alloy, for example, of an alloy based on germanium, tellurium, and antimony, and the first element is made of a metal or of a metal alloy, for example, of titanium nitride or of a titanium-silicon nitride.

According to an embodiment, the thickness of the second element is in the range from 2 nm to 20 nm, the dimension of the second element in a first horizontal direction is smaller than 70 nm, the dimension of the second element in a second horizontal direction is in the range from 20 nm to 60 nm, the height of the first element is in the range from 30 nm to 80 nm, the dimension of the first element in a first horizontal direction is smaller than 70 nm, the dimension of the lower surface of the first element in a second horizontal direction is in the range from 20 nm to 60 nm, and the dimension of the upper surface of the first element in a second horizontal direction is in the range from 2 nm to 10 nm.

According to an embodiment, the method comprises: forming a stack of layers, the stack comprising, in this order, a second insulating layer, a third layer made of the material of the second element, and a fourth insulating layer; forming a first cavity crossing the stack and exposing a first sidewall of the third layer; and forming the first element on the first wall.

According to an embodiment, the method comprises the forming of a second cavity exposing a second lateral surface of the first element.

According to an embodiment, the method comprises the forming of the strip on the second lateral surface of the first element.

According to an embodiment, the method comprises the forming of the fourth selection element, on the second lateral surface of the first element.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which:

FIG. 3A shows the result of a step of a method of manufacturing the embodiment of FIG. 2;

FIG. 3B shows the result of another step of a method of manufacturing the embodiment of FIG. 2;

FIG. 3C shows the result of another step of a method of manufacturing the embodiment of FIG. 2;

FIG. 3D shows the result of another step of a method of manufacturing the embodiment of FIG. 2;

FIG. 3E shows the result of another step of a method of manufacturing the embodiment of FIG. 2;

FIG. 3F shows the result of another step of a method of manufacturing the embodiment of FIG. 2.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1A:
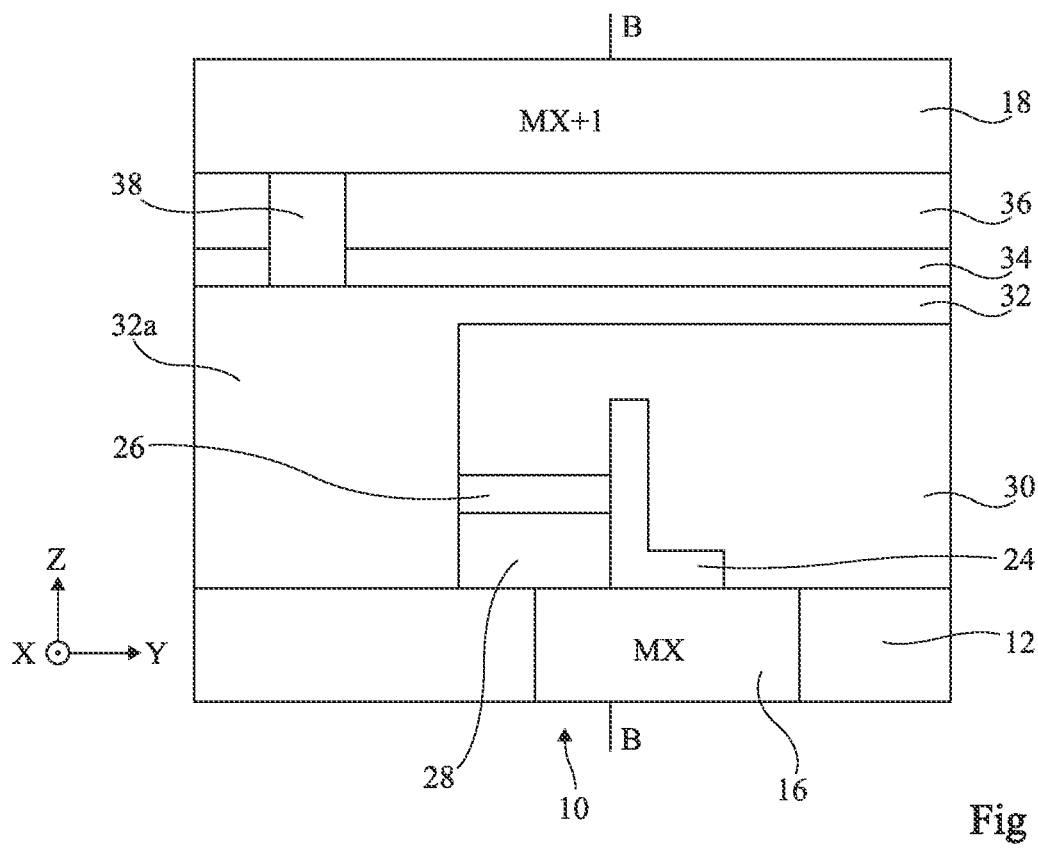
FIG. 1A shows a cross-section view of an embodiment of a phase-change memory cell.
Figure 1B:
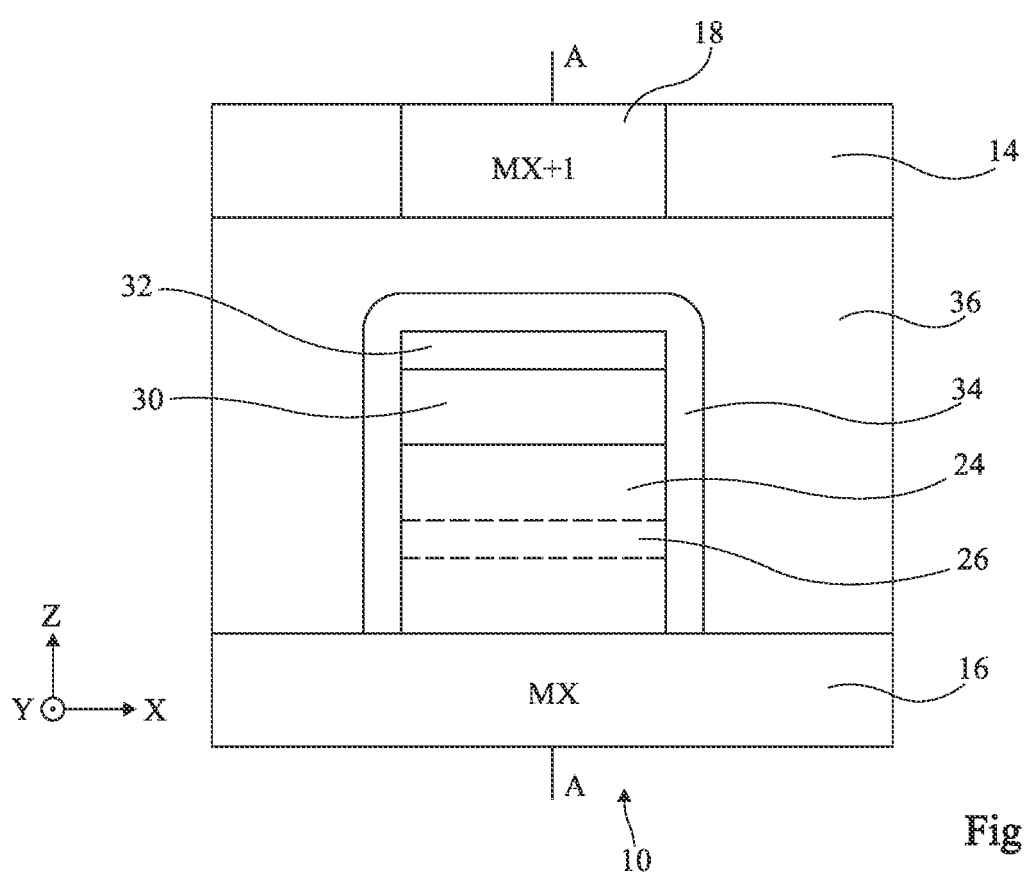
FIG. 1B shows a cross-section view of an embodiment of a phase-change memory cell.

FIG. 1A shows a cross-section view of an embodiment of a phase-change memory cell 10. FIG. 1B shows a cross-section view of phase-change memory cell 10. More particularly, FIG. 1A shows a cross-section view of a portion of a device comprising cell 10 along a plane A-A of FIG. 1B and FIG. 1B shows a cross-section view of a portion of a device comprising cell 10 along a plane B-B of FIG. 1A.

Cell 10 is located in a back-end-of-line level, e.g., an interconnection network, of the device. The interconnection network may be a plurality of conductive and dielectric layers that work together to create an integrated circuit. Cell 10 is here located between a metal track level or metallization level MX and a metal track level MX+1 of the interconnection network. FIGS. 1A and 1B show an insulating layer 12 of the interconnection level MX located under memory cell 10 and an insulating layer 14 of the interconnection level MX+1 located above memory cell 10.

A conductive track 16 is located in insulating layer 12 in the metallization level MX. Track 16 crosses layer 12, that is, extends all along the height of layer 12, in the z-axis. Track 16 for example extends along a plurality of memory cells such as that shown in FIGS. 1A and 1B. Track 16 for example extends in a direction X, in the x-axis, e.g., corresponding to the direction of a word line. Track 16 is thus, in some embodiments, coupled to the cells of the word line.

A conductive track 18 is located in insulating layer 14 in the metallization level MX+1. Track 18 crosses layer 14, that is, extends all along the height of layer 14, in the z-axis. Track 18 for example extends along a plurality of memory cells such as those shown in FIGS. 1A and 1B. Track 18 for example extends along a direction Y, in the y-axis, e.g., corresponding to the direction of a bit line. Track 18 is thus, in some embodiments, coupled to the cells of the bit line. Track 18, in some embodiments, extends in a direction orthogonal to the direction along which track 16 extends.

Insulating layer 14 is, in some embodiments, made of a material having a very dielectric constant, that is, a so-called "Ultra Low K" material. Insulating layer 12 is for example made of a material having a very low dielectric constant, that is, a so-called "Ultra Low K" material, for example, the same material as layer 14. Layer 12 may alternately comprise a stack of insulating layers, for example, a stack comprising a layer made of a so-called "Ultra Low K" material and a layer made of another insulating material, for example, made of silicon nitride.

Conductive tracks 16 and 18 are made of conductive material, e.g., metal or conductive compounds. In some embodiments, the conductive tracks are made of copper or of tungsten.

In some embodiments, layers 12, 14, and 20 are planar and parallel layers. In other words, each of layers 12, 14 comprises a lower surface and an upper surface which are planar and horizontal, e.g., in the x-y plane. In some embodiments, the upper and lower surfaces of each layer 12, 14 are substantially parallel to each other. Further, in some embodiments, the upper and lower surfaces of layer 12 are, in some embodiments, parallel to the upper and lower surfaces of layer 14. Tracks 16 and 18 thoroughly cross respective layers 12, 14. Tracks 16 and 18 each have an upper surface and a lower surface which are planar and horizontal, e.g., in the x-y plane, substantially parallel to each other. The lower and upper surfaces of tracks 16 and 18 are respectively coplanar with the lower and upper surfaces of layers 12, 14.

Cell 10 comprises a resistive element 24, for example, made of a metal or a metal alloy, for example, of titanium nitride or of titanium-silicon nitride.

Element 24 is substantially L-shaped, in a cross-sectional view. In other words, element 24 comprises a vertical portion, in the z-axis, and a horizontal portion, in the x-y plane. Horizontal means in the plane formed by directions X and Y. Vertical means in the plane formed by direction X or Y and a direction Z orthogonal to the plane formed by directions X and Y. Vertical means in the plane formed by directions X and Z.

The horizontal portion of element 24 extends on track 16, more particularly on the upper surface of track 16. The horizontal portion of element 14 is, in some embodiments, entirely on track 16. The horizontal portion is thus in contact with track 16. The horizontal portion of element 24 for example substantially has the shape of a parallelogram.

The vertical portion of element 24 extends from the upper surface of track 16. The vertical portion for example extends in a plane substantially orthogonal to the plane of the lower surface. The vertical portion, in some embodiments, extends in the plane of FIG. 1B, that is, a plane formed by directions X and Z. The vertical portion of element 24 for example substantially has a parallelogram shape.

Cell 10 further comprises an element 26 made of a phase-change material. Element 26 is shown in FIG. 1B by dotted lines. Element 26 is for example made of a chalcogen-based alloy, for example, of an alloy based on germanium, tellurium, and antimony (GST).

Element 26 is a planar layer, in some embodiments, extending horizontally, that is, in the plane formed by directions X and Y. Element 26, in some embodiments, extends in a plane substantially parallel to the upper surface of layer 12. Element 26, in some embodiments, comprises an upper surface and a lower surface, substantially parallel to each other, and, in some embodiments, substantially parallel to the upper surface of layer 12. Element 26 for example substantially has a cuboid shape.

Element 26 extends from element 24, in some embodiments, from the vertical surface of element 24. Element 26 is thus in contact with element 24. More particularly, a lateral surface of element 26 is in contact with the vertical portion of element 24. Thus, element 26 is in lateral contact with element 24. Element 26 is entirely located at a same distance from the upper surface of layer 12 as a portion of element 24. Element 26 extends, in direction X, over the dimension of element 24, as shown in FIG. 1B. The lateral surfaces of element 26 are, in some embodiments, coplanar with the lateral surfaces, having an L shape, of element 24. Element 26 is thus not located under or on top of element 26. Element 24 is not separated from tracks 18 and 16 by element 26. A portion of element 24 is located above the level of element 26 and a portion is located under the level of element 26. The horizontal dimension of element 24 in the cross-section plane of FIG. 1B, e.g., the z-x place, that is, the dimension in direction X, is for example smaller than 70 nm, for example, in the range from 20 nm to 70 nm, and in some embodiments, is substantially equal to 50 nm. The horizontal dimension of element 26 in the cross-section plane of FIG. 1B, that is, the dimension in direction X, is for example smaller than 70 nm, for example, in the range from 20 nm to 70 nm, and in some embodiments, is substantially equal to 50 nm.

The horizontal dimension of the lower surface of element 24, that is, the dimension of the interface between element 24 and track 16, in the cross-section plane of FIG. 1A, e.g., in the z-y plane, that is, in direction Y, is for example in the range from 20 nm to 60 nm. The horizontal dimension of the vertical portion of element 24, that is, the dimension of the upper surface of element 24, in the cross-section plane of FIG. 1A, that is, in direction Y, is for example in the range from 2 nm to 10 nm. The horizontal dimension of element 26 in the cross-section plane of FIG. 1A, in the z-y plane, that is, the dimension in direction Y, is for example in the range from 20 nm to 60 nm.

The thickness of element 26, that is, the distance between the upper surface and the lower surface, e.g., in the z-axis, is smaller than the height of element 24, that is, the dimension of the vertical surface of element 24 in the same direction as the thickness of element 26, that is, direction Z. In some embodiments, the thickness of element 26 is at least from three to five times smaller than the height of element 24. The height of element 24, that is, the dimension in direction Z, is for example in the range from 30 nm to 80 nm. The thickness of element 26, that is, the dimension in direction Z, is for example in the range from 2 nm to 20 nm.

Element 26 rests on a portion 28 made of an insulating material, for example, of silicon nitride. Element 26 is separated from layer 12 and from track 16 by insulating material portion 28. Element 26 is thus not in contact with layer 12 or track 16.

The value of the resistance between element 26 and track 16 depends on the height of portion 28. Thus, the height of portion 28 is selected according to the desired resistance.

As a variant, element 24 may have the shape of a spacer having a vertical surface, in contact with element 26, and a horizontal surface, in contact with track 16.

Elements 26 and 24 are covered with an insulating layer 30, for example, made of silicon nitride. Layer 30 further covers track 16 and layer 12. A lateral surface of element 26 is left exposed by layer 30. In other words, layer 30 does not cover one of the lateral surfaces of element 26. More particularly, layer 30, in some embodiments, does not cover a lateral surface of the element 26 opposite to the surface in contact with element 24.

The device comprises, for each bit line, a conductive strip 32. Strip 32 is for example made of a metal or of a metal alloy, for example, of titanium nitride or of tungsten. Strip 32 comprises a portion 32a extending along layer 30 to reach element 26, more particularly to reach the exposed lateral surface of element 26. Strip 32 is thus in contact with element 26. Element 26 is thus connected, by one end, to element 24 and by another end to strip 32. The voltage enabling to program the memory cell is thus applied between element 24 and strip 32. This portion of the strip, in some embodiments, extends all the way to the upper surface of layer 12. The dimensions of element 26 are such that strip 32 is not in contact with track 16.

Another portion of strip 32, in some embodiments, extends on insulating layer 30 to reach another memory cell, not shown in FIG. 1A.

Each bit line is surrounded with an insulating layer 34, for example, made of silicon nitride. Layer 34 surrounds the assembly including strip 32, insulating layer 30, portion 28, and elements 24 and 26. Layer 34 particularly covers the upper surface of strip 32 and of the sidewalls, in some embodiments, coplanar to one another, of strip 32, of insulating layer 30, of portion 28, and of elements 24 and 26.

An insulating layer 36 covers layer 34 and layer 12. Insulating layer 36 is, in some embodiments, made of a material having a very low dielectric constant ("Ultra Low K"). Layer 36 corresponds to the layer where the conductive vias coupling the conductive tracks MX located in layer 12 to the tracks MX+1 located in layer 14 are formed. Layer 36 separates the different bit lines.

Conductive vias 38 for example cross layer 36 and layer 34 to couple a track MX+1 to conductive strip 32.

It could have been chosen to form a vertical stack of the resistive element, of the phase-change material, and of the electrode. Thus, it could have been chosen to form a layer made of the phase-change material on the resistive element, and to form the electrode on the layer of phase-change material. However, each cell would have a larger thickness than in the embodiment described in relation with FIGS. 1A and 1B, typically a thickness greater than 150 nm with current technologies. Thus, it would not be possible to locate the memory cells in a standard interconnection network without locally or generally modifying the thickness of the network levels. Such modifications would cause resistance and capacitance variations of the links between levels, which would cause modifications of the behavior of components, for example, transistors, coupled by the interconnection network.

Figure 2:
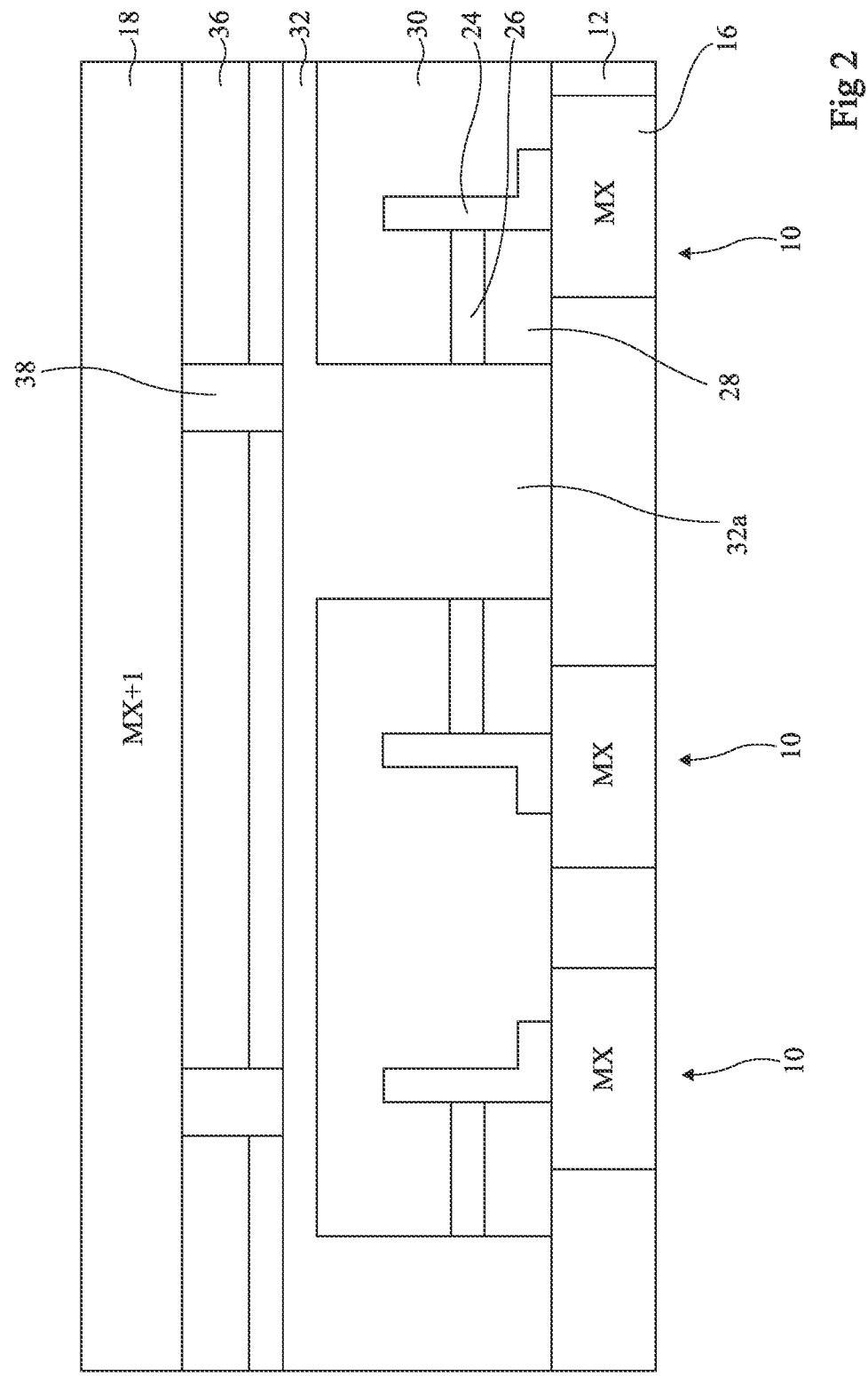
FIG. 2 shows a cross-section view of a device comprising a plurality of cells such as that of FIGS. 1A and 1B.

FIG. 2 shows a cross-section view of a device comprising a plurality of cells such as that of FIGS. 1A and 1B. FIG. 2 is a cross-section view along the plane of FIG. 1A. The elements identical to elements of FIGS. 1A and 1B will not be described again. FIG. 2 shows three memory cells of a same bit line.

The cells are formed like the cells previously described in relation with FIGS. 1A and 1B.

The cells are alternated. In other words, each memory cell corresponds to the planar symmetry of the neighboring cell along a horizontal plane, orthogonal to the plane of FIG. 2.

The elements 26 of two neighboring cells face each other. Similarly, the elements 24 of two neighboring cells face each other.

Each portion 32a of strip 32 extending towards layer 12 is in contact with the elements 26 of two neighboring cells. Thus, each portion 32a of strip 32 extending towards layer 12 allows the contact of two memory cells. There thus are substantially twice less portions 32a than cells 10.

The elements 26 of two neighboring cells separated by strip 32 are not separated by the elements 24 of the cells. Similarly, the elements 24 of two neighboring cells only separated by layer 30 are not separated by the elements 26 of the cells.

FIGS. 3A to 3F illustrate the results of steps, in some embodiments, successive, of an implementation mode of a method of manufacturing the embodiment of FIGS. 1A, 1B, and 2. FIGS. 3A to 3F are cross-section views along the plane of FIG. 1A.

FIG. 3A shows the result of a step of a method of manufacturing the embodiment of FIG. 2.

This step comprises a step of forming the interconnection level MX comprising tracks 16. More particularly, this step comprises the forming of insulating layer 12. Layer 12 comprises, in this example, a lower layer 12a made of a so-called "ultra low K," material that is, a material having a low dielectric constant, and an upper layer 12b made of another insulating material, in some embodiments, silicon nitride. Layer 12b, in some embodiments, entirely covers layer 12a.

Cavities crossing layer 12 are formed at the locations of conductive tracks 16. The cavities are then filled with the material of tracks 16, for example, a metal, in some embodiments, copper or tungsten, to form said tracks 16. The cavities are filled so that the material of tracks 16 is not located outside of the cavities.

During this step, a stack 40 of layers is formed on layer 12 and on tracks 16. Stack 40 comprises, in this order from layer 12:
an insulating layer 42;
a layer 44 made of a phase-change material; and
an insulating layer 46.

Insulating layer 42 is made of the material of portion 28 (FIG. 1A), for example, of silicon nitride. Layer 44 is made of the material of element 26. Layer 46 is, in some embodiments, made of the same material as layer 42, for example, of silicon nitride.

The height of stack 40 is substantially equal to the desired height of the vertical portion of element 24 (FIG. 1A). As described in relation with FIGS. 1A and 1B, the height of layer 42, corresponding to the height of portion 28, depends on the desired value of the resistance between each element 26 and the corresponding track 16.

FIG. 3B shows the result of another step of a method of manufacturing the embodiment of FIG. 2.

During this step, an etching is performed to form cavities 48 (48a, 48b) in stack 40. Each cavity 48 crosses stack 40. Thus, the bottom of cavities 48 corresponds to layer 12, in particular, to layer 12b, and to tracks 16. Cavities 48 form between one another strips 50 from stack 40. Stack 40 is etched to form a strip 50 for each word line, that is, for each track 16 corresponding to a word line. Each strip 50 comprises a strip 42a of layer 42, a strip 44a of layer 44, and a strip 46a of layer 46. The sidewalls of cavities 48 correspond to the sides of strips 50.

Each strip 50 extends in direction X, that is, the direction of the word lines. Each strip 50 partially covers a track 16 and partially covers layer 12. Each strip 50, in some embodiments, extends all along the length of track 16, that is, over the entire dimension of track 16 in direction X.

In some embodiments, the bottom of certain cavities 48, for example, cavities 48a, is partially formed by the upper surfaces of two tracks 16 and by the upper surface of layer 12 located between the two tracks 16. In some embodiments, the bottom of the other cavities, for example, cavities 48b, is only formed by the upper surface of layer 12.

Cavities 48a and 48b are alternated. Thus, each strip 50 separates a cavity 48a from a cavity 48b. In other words, each cavity 48a is close to two cavities 48b and conversely.

FIG. 3C shows the result of another step of a method of manufacturing the embodiment of FIG. 2.

During this step, a layer 62 is formed on the bottom and the walls of each cavity 48b. Layers 62 are made of an insulating material, in some embodiments, an insulating material capable of being etched selectively over the material of layers 42 and 46, for example, of silicon oxide. Thus, in some embodiments, layers 62 may be removed without removing the strips 42a and 46a of stacks 50. In some embodiments, layer 62 also at least partially covers the upper surface of the strips 50 forming the edges of cavity 48b. Layers 62 do not extend in cavities 48a. More particularly, the walls and the bottom of cavities 48a are not covered with layers 62. Layers 62, in some embodiments, do not cover tracks 16. In other words, in some embodiments, no portion of tracks 16 is covered with layers 62.

Each strip 50 thus comprises a first sidewall covered by layer 62 and a second sidewall, opposite to the first sidewall, which is not covered by layer 62. In some embodiments, layer 62 at least partially covers the upper surface of strip 50. In the example of FIG. 3C, each layer 62 entirely covers the upper surface of two strips 50.

FIG. 3D shows the result of another step of a method of manufacturing the embodiment of FIG. 2.

During this step, elements 24 are formed. More particularly, a layer, not shown, made of the material of elements 24 is conformally formed on the structure. The layer, not shown, thus covers the walls and the bottom of cavities 48a and the upper surface of layers 62. Thus, the layer, not shown, is in contact with the layer 44 of the neighboring strips 50 and with the tracks 16 forming the bottom of the cavity.

Spacers 64 are then formed. The spacers cover the layer, not shown, at the level of the walls of cavities 48a and at the foot of the walls, to cover the portions of the layer, not shown, forming elements 24. The layer, not shown, is then removed by an etch step, to remove the portions of the layer, not shown, which are not located under the spacers. L-shaped elements 24 are thus formed, each being in contact with a layer 44 and a track 16. Each cavity 48a, in some embodiments, comprises two L-shaped elements 24, located on opposite walls of cavity 48a. Each element 24 formed during this step, in some embodiments, extends all along the length of a track 16. The portion of the layer, not shown, located between the two elements 24 is removed during this step, and the two elements 24 are thus not in contact with each other.

Layers 62 are then removed.

FIG. 3E shows the result of another step of a method of manufacturing the embodiment of FIG. 2.

During this step, insulating layers 30 are formed. Each layer 30 fills a cavity 48a and at least partially covers the upper surfaces of the neighboring strips 50 of the cavity. In the example of FIG. 3E, layers 30 entirely cover the upper surfaces of strips 50. Layers 30 thus cover elements 24. Elements 24 are thus surrounded with insulating materials, except for the portions of elements 24 in contact with strips 44a and tracks 16.

Layers 30 do not fill cavities 48b. Thus, the sidewalls of layers 44 located at the level of cavities 48b are exposed.

FIG. 3F shows the result of another step of a method of manufacturing the embodiment of FIG. 2.

During this step, a metal layer 56 is formed over the entire structure. Layer 56 fills cavities 48b and covers layers 30. The material of layer 56 is the material of strip 32 (FIGS. 1A and 1B). Layer 56 is thus for example made of titanium nitride, of tungsten, or of copper.

Layer 56 is, in some embodiments, partially removed, for example, by one or more of chemical mechanical polishing (CMP) or etching, so that the upper surface of layer 56 is planar. The thickness of layer 56 such as deposited is thus sufficiently large for layer 56, after CMP, to cover layer 30 and to totally fill cavities 48b.

The method of manufacturing the memory cells of FIGS. 1A, 1B, and 2 further comprises steps, not shown. In particular, the method comprises the individualization of the cells. In other words, the method comprises etching cavities, not shown, crossing conductive layer 56, insulating layer 30, elements 24, spacers 62, and strips 50. The cavities, not shown, extend in the bit line direction, that is, in direction Y. The cavities, not shown, thus separate the neighboring memory cells in a same word line. The etching thus separates, for each word line, layer 56 into strips 32 distinct at each cell, strip 42a into portions 28 distinct at each cell, strips 44a into elements 26 distinct at each cell, and elements 24 into elements 24 distinct at each cell.

The manufacturing method further comprises the forming of insulating layers 34 (FIGS. 1A and 1B), covering the word lines. In particular, layer 34 covers the walls of the cavities, not shown, formed during the cell individualization and covers the upper surface of strips 32.

The method may then comprise the forming of insulating layer 36, for example corresponding to the insulating layer separating layer 12 comprising tracks MX and layer 14 comprising tracks MX+1. Thus, layer 36 is for example crossed by conductive vias connecting tracks MX and tracks MX+1. The level of the interconnection network comprising tracks MX+1 is then formed on layer 36.

Figure 4:
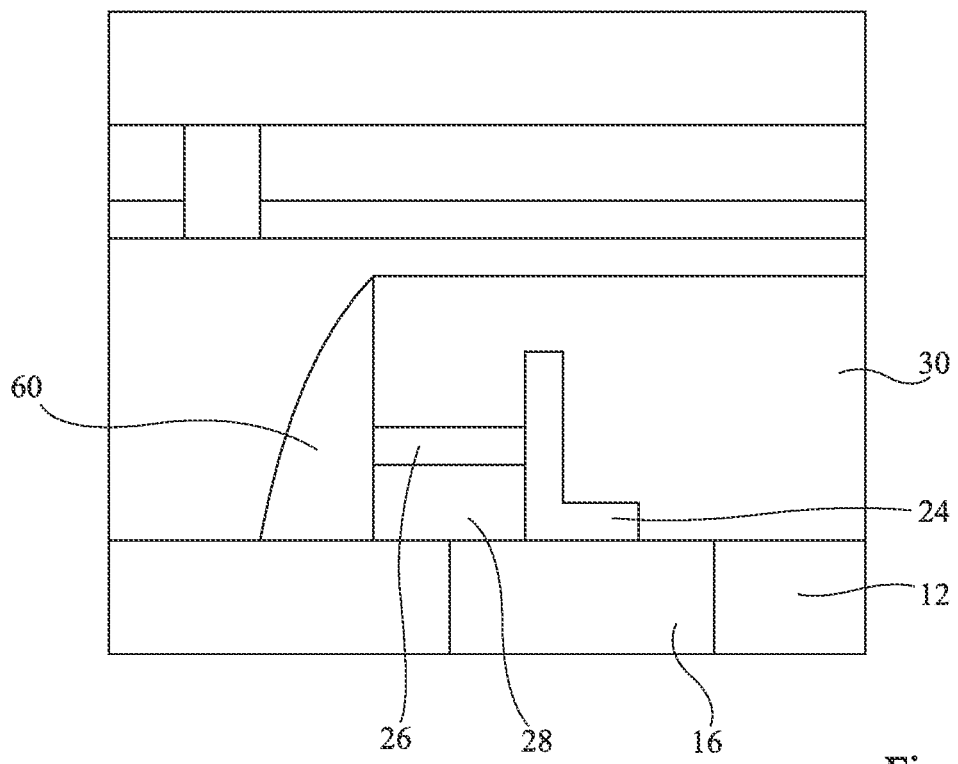
FIG. 4 shows another embodiment of a phase-change memory cell.

FIG. 4 shows another embodiment of a phase-change memory cell.

The embodiment of FIG. 4 differs from the embodiment of FIGS. 1A, 1B, and 2 in that it comprises a selection element 60.

Element 60, in some embodiments, has a spacer shape. Element 60 vertically extends on sidewalls of portion 28, of element 26, and of layer 30. The sidewalls of portion 28, element 26, and layer 30 are, in some embodiment, coplanar to one another. Element 60, in some embodiments, extends all the way to the upper surface of layer 30. Element 60 extends horizontally on layer 12 at the foot of the sidewall of portion 28.

Element 60 forms the selection element of each cell. In other words, during the writing into or the reading from a cell, selection element 60 enables current to flow through the element 26 of this cell. The selection element thus enables to limit the current flowing through the other memory cells (not selected) and which might disturb the reading from or the writing into the cell.

Selection element 60 is, in some embodiments, of ovonic threshold switching type (OTS). Element 60 is for example made of a chalcogen material or of an alloy of chalcogen material. For example, the element is made of germanium, selenium, antimony, or of an alloy of one or a plurality of these chemical elements. In some embodiments, element 60 is made of an alloy of chalcogen materials which optimizes the operating parameters of a threshold switch, or selection element, that is, for example, an alloy comprising:

arsenic, with an atomic percentage in the range from 9% to 39%, germanium, with an atomic percentage in the range from 10% to 40%, silicon, with an atomic percentage in the range from 5% to 18%, nitrogen, with an atomic percentage in the range from 0% to 10%, and an alloy of sulfur, selenium, and tellurium.

In some embodiments, the ratio of the atomic percentage of sulfur to the atomic percentage of selenium in the alloy of sulfur, selenium, and tellurium is in the range from 0.25 to 4, and the ratio of the atomic percentage of sulfur to the atomic percentage of tellurium in the alloy of sulfur, selenium, and tellurium is in the range from 0.11 to 1. As a variant, the selection element may be made of another material causing a rectifying effect, for example, to form a Schottky diode.

The method of manufacturing the embodiment of FIG. 4 differs from the method described in relation with FIGS. 3A to 3F in that it comprises an additional step of forming of element 60 between the steps of FIGS. 3E and 3F.

During this additional step, spacers are formed on the walls of cavities 48b. More particularly, this step comprises the conformal forming of a layer, not shown, made of the material of elements 60. Said layer, not shown, particularly covers the walls and the bottom of cavities 48b, as well as an upper surface of layer 30. This step then comprises a step of anisotropic etching of the layer, not shown, to remove the portions of the layer, not shown, located on the upper surface of layer 30 and in the middle of the bottom of cavities 48b. The portions located on the walls of cavities 48b and at the foot of the walls of cavities 48b are thus not removed and form the spacers.

Spacers extend all along the height of the walls of cavities 48b and over a portion of layer 12 located at the foot of the walls.

The width of the spacers, that is, the dimension of the spacers in the direction of the bottom of cavity 48b, depends on the height of cavity 48b. Thus, the thickness of layer 30, in particular above stack 40, is selected to obtain spacers on each side of the cavity which are not in contact with one another.

An advantage of the described embodiments is that element 24 is confined, that is, element 24 directly heats, by itself, when it conducts a current, instead of being indirectly heated by a resistive element which would heat and would transfer the heat. The power loss, and thus the power consumption, is thus decreased.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

Device may be summarized as including phase-change memory cells, each memory cell (10) including a first resistive element (24) in lateral contact with a second element (26) made of a phase-change material.

The first element (24) is L-shaped.

The first element (24) has the shape of a spacer.

The first element (24) may include a lower surface in contact with a conductive track (16), the track being surrounded with a first insulating layer (12).

The second element (26) may be separated from the first insulating layer (20) and from the conductive track (16) by an insulating portion (28).

The second element (26) may be a planar and horizontal layer.

A first sidewall of the second element (26) may be in contact with a substantially vertical wall of the first element (24).

A second sidewall of the second element (26), opposite to the first wall, may be in contact with a conductive strip (32).

A second sidewall of the second element (26), opposite to the first wall, may be in contact with a fourth selection element (60), the fourth element (60) being covered with a conductive strip (32).

The device may include an interconnection network, and each memory cell (10) may be located between two levels of the interconnection network.

The second element (26) may be made of a chalcogen-based alloy, in some embodiments of an alloy based on germanium, tellurium, and antimony, and the first element (24) may be made of a metal or of a metal alloy, in some embodiments of titanium nitride or of titanium-silicon nitride.

The thickness of the second element (26) may be in the range from 2 nm to 20 nm, the dimension of the second element in a first horizontal direction (X) may be smaller than 70 nm, the dimension of the second element (26) in a second horizontal direction (Y) may be in the range from 20 nm to 60 nm, the height of the first element may be in the range from 30 nm to 80 nm, the dimension of the first element (24) in a first horizontal direction (X) may be smaller than 70 nm, the dimension of the lower surface of the first element (24) in a second horizontal direction (Y) may be in the range from 20 nm to 60 nm, and the dimension of the upper surface of the first element (24) in a second horizontal direction (Y) may be in the range from 2 nm to 10 nm.

Method of manufacturing a device may be summarized as including phase-change memory cells (10), the method including the forming, for each cell, of a first resistive element (24) in lateral contact with a second element (26) made of a phase-change material.

Method may include forming a stack (40) of layers, the stack (40) may include, in this order, a second insulating layer (42), a third layer (44) made of the material of the second element (26), and a fourth insulating layer (46); forming a first cavity (48) crossing the stack (40) and exposing a first sidewall of the third layer (44); and forming the first element on the first wall.

Method may include the forming of a second cavity (54) exposing a second lateral surface of the first element (26).

Method may include the forming of the strip (32) on the second lateral surface of the first element (26).

Method may include the forming of the fourth selection element (60), on the second lateral surface of the first element (26).

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   phase-change memory cells, each phase-change memory cell of the phase-change memory cells including:
   a first metallization level on a first side of each phase-change memory cell;
   a second metallization level on a second side of each phase-change memory cell opposite the first side along a first direction;
   a first element of a conductive material on the first metallization level, the first element having a first portion extending along the first direction and a second portion extending along a second direction transverse to the first direction; and
   a second element of a phase-change material extending along the second direction and coupled to the first portion of the first element, the second element being entirely separated from the first metallization level and the second metallization level.

2. The device according to claim 1, wherein the first element is L-shaped in a cross-section.

3. The device according to claim 1, wherein the first element has a shape of a spacer.

4. The device according to claim 1, wherein the first metallization level includes a first conductive track and a first insulating layer, the first conductive track being surrounded by the first insulating layer, wherein the first element has a first surface in contact with the first conductive track.

5. The device according to claim 4, comprising an insulation region that separates the second element from the first insulating layer and from the first conductive track.

6. The device according to claim 1, wherein the second element is a planar and horizontal layer.

7. The device according to claim 1, wherein a first sidewall of the second element is in contact with a sidewall of the first element.

8. The device according to claim 7, comprising a conductive strip, wherein a second sidewall of the second element, opposite to the first sidewall, is in contact with the conductive strip.

9. The device according to claim 7, comprising a selection element of an ovonic threshold switching type and a conductive strip, the selection element being covered by the conductive strip, wherein a second sidewall of the second element, opposite to the first sidewall, is in contact with the selection element.

10. The device according to claim 1, comprising an interconnection network including the first metallization level and the second metallization level, and each phase-change memory cell of the phase-change memory cells is located between the first metallization level and the second metallization level of the interconnection network.

11. The device according to claim 1, wherein the phase-change material of the second element is a chalcogen-based alloy including germanium, tellurium, and antimony, and the first element is made of a metal or a metal alloy including one or more of titanium nitride or titanium-silicon nitride.

12. The device according to claim 1, wherein a thickness of the second element along the first direction is in a range from 2 nm to 20 nm, inclusive, a first dimension of the second element along the second direction is smaller than 70 nm, a second dimension of the second element along the second direction is in a range from 20 nm to 60 nm, inclusive, a height of the first element along the first direction is in a range from 30 nm to 80 nm, inclusive, a third dimension of the first element in the second direction is smaller than 70 nm, a fourth dimension of the second portion of the first element in the second direction is in a range from 20 nm to 60 nm, inclusive, and a fifth dimension of the first portion of the first element in the second direction is in a range from 2 nm to 10 nm, inclusive.

13. A structure, comprising:
a first metallization level including a first conductive structure and a first dielectric layer adjacent to the first conductive structure;
a second metallization level including a second conductive structure and a second dielectric layer adjacent to the second conductive structure;
a resistive element between the first metallization level and the second metallization level in a first direction, the resistive element including a first portion and a second portion integrated with the first portion, the first portion extending in the first direction, the second portion extending beyond the first portion in a second direction, the second direction traversing the first direction, the second portion in contact with the first conductive structure, the first portion spaced away from the second metallization level in the first direction; and
a phase-change element of a phase-change material, the phase-change element in contact with the first portion of the resistive element in the second direction and by a first edge surface of the phase-change element, the phase-change element spaced away from both the first metallization level and the second metallization level in the first direction.

14. The structure of claim 13, comprising a contact structure between the first metallization level and the second metallization level, the contact structure coupled to the second conductive structure and coupled to the phase-change element by a second edge surface of the phase-change element, the second edge surface opposite to the first edge surface.

15. The structure of claim 14, comprising a switch element of a chalcogen material or of an alloy of the chalcogen material, the switch element positioned between the contact structure and the phase-change element.

16. A device, comprising:
a first metal track level including a first conductive track in a first insulating layer;
a second metal track level including a second conductive track in a second insulating layer;
an L-shaped resistive element between the first and second metal tracks, the L-shaped resistive element including a first portion extending along a first direction on the first conductive track and a second portion extending along a second direction transverse to the first direction;
a phase-change element extending along the first direction and coupled to the second portion of the L-shaped resistive element, the phase-change element being spaced from both the first metal track level and the second metal track level; and
an insulating portion extending along the first direction between the phase-change element and the first metal track level.

17. The device of claim 16, wherein the insulating portion is on both the first insulating layer and the first conductive track.

18. The device of claim 16, further comprising a third insulating layer on the first metal track level and surrounding the L-shaped resistive element, the third insulating layer leaving a first surface of the phase-change element exposed.

19. The device of claim 18, further comprising a conductive strip on the third insulating layer and the first metal track level, the conductive strip being coupled to the first surface of the phase-change element.

20. The device of claim 19, further comprising:
a fourth insulating layer extending along the first direction between the conductive strip and the second metal track level; and
a conductive via extending entirely through the fourth insulating layer along the second direction and coupled to both the conductive strip and the second metal track level.

* * * * *